US012610722B2

(12) United States Patent
Hu et al.

(10) Patent No.: US 12,610,722 B2
(45) Date of Patent: Apr. 21, 2026

(54) DISPLAY PANEL WITH COLOR RESIST STACKS DISPOSED IN NON-LIGHT-EMITTING REGIONS

(71) Applicant: WUHAN CHINA STAR OPTOELECTRONICS SEMICONDUCTOR DISPLAY TECHNOLOGY CO., LTD., Wuhan (CN)

(72) Inventors: Kai Hu, Wuhan (CN); Boyu Su, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1240 days.

(21) Appl. No.: 17/599,702

(22) PCT Filed: Aug. 6, 2021

(86) PCT No.: PCT/CN2021/111169
§ 371 (c)(1),
(2) Date: Feb. 2, 2023

(87) PCT Pub. No.: WO2023/004872
PCT Pub. Date: Feb. 2, 2023

(65) Prior Publication Data
US 2024/0049579 A1 Feb. 8, 2024

(30) Foreign Application Priority Data
Jul. 29, 2021 (CN) .......................... 202110862582.4

(51) Int. Cl.
*H10K 59/80* (2023.01)
*H10K 59/38* (2023.01)
*H10K 102/00* (2023.01)

(52) U.S. Cl.
CPC ......... *H10K 59/8791* (2023.02); *H10K 59/38* (2023.02); *H10K 59/873* (2023.02); *H10K 2102/351* (2023.02)

(58) Field of Classification Search
None
See application file for complete search history.

(56) References Cited

U.S. PATENT DOCUMENTS 9,958,723 B2 * 5/2018 Lee .................. G02F 1/133514
2013/0334507 A1 12/2013 Shimoji
(Continued)

FOREIGN PATENT DOCUMENTS

CN 108363233 A 8/2018
CN 109887931 A 6/2019
(Continued)

OTHER PUBLICATIONS

Chinese Office Action issued in corresponding Chinese Patent Application No. 202110862582.4 dated Jun. 6, 2022, pp. 1-6.
(Continued)

*Primary Examiner* — Nduka E Ojeh
(74) *Attorney, Agent, or Firm* — PV IP PC; Peter Stecher; Wei Te Chung

(57) ABSTRACT

A display panel is provided. In the display panel, color resists are disposed in light-emitting regions and correspond to light-emitting pixels, and overlapping color resists are disposed in non-light-emitting regions, so as to replace polarizers. This increases a light transmittance of the display panel, reduces a reflectivity of the display panel, and reduces a thickness of the display panel. Furthermore, because the (Continued)

overlapping color resists are used to replace a black matrix
in the non-light-emitting regions, process steps are reduced.

20 Claims, 5 Drawing Sheets

(56)                    References Cited

U.S. PATENT DOCUMENTS

| | | | | |
|---|---|---|---|---|
| 2015/0318447 | A1* | 11/2015 | Choi ..................... | H10K 19/10 |
| | | | | 257/98 |
| 2017/0076678 | A1* | 3/2017 | Lee ........................ | G02F 1/1336 |
| 2017/0123317 | A1* | 5/2017 | Kamura ................ | G03F 7/0007 |
| 2021/0367015 | A1* | 11/2021 | Kim ........................ | H10K 59/38 |
| 2022/0199690 | A1* | 6/2022 | Lee ........................ | H10K 59/12 |

FOREIGN PATENT DOCUMENTS

| | | | |
|---|---|---|---|
| CN | 110034167 | A | 7/2019 |
| CN | 110707132 | A | 1/2020 |
| CN | 111029388 | A | 4/2020 |
| CN | 113113453 | A | 7/2021 |

OTHER PUBLICATIONS

International Search Report in International application No. PCT/
CN2021/111169 mailed on Apr. 28, 2022.
Written Opinion of the International Searching Authority in International application No. PCT/CN2021/111169, mailed on Apr. 28,
2022.

* cited by examiner

DISPLAY PANEL WITH COLOR RESIST STACKS DISPOSED IN NON-LIGHT-EMITTING REGIONS

RELATED APPLICATIONS

This application is a Notional Phase of PCT Patent Application No. PCT/CN2021/111169 having international filing date of Aug. 6, 2021, which claims the benefit of priority of Chinese Patent Application No. 202110862582.4 filed on Jul. 29, 2021. The contents of the above applications are all incorporated by reference as if fully set forth herein in their entirety.

FIELD OF INVENTION

The present disclosure relates to the technical field of display, and particularly to a display panel.

BACKGROUND

Organic light-emitting diode (OLED) display devices are widely used due to their advantages such as wide viewing angles, ultra-high contrast ratios, and fast response times. However, during the use of OLED display devices, because light transmittances of their polarizers are relatively low, generally 43.5%, the OLED display devices have relatively high heat generation and power consumption in the case of high-brightness display screens.

Therefore, current OLED display devices have a technical problem that the OLED display devices have relatively high heat generation and power consumption due to relatively low light transmittances of their polarizers.

SUMMARY OF DISCLOSURE

The present disclosure provides a display panel to solve the technical problem of the current OLED display devices that the OLED display devices have the relatively high heat generation and power consumption due to the relatively low light transmittances of their polarizers.

In order to solve the above technical problem, the present disclosure provides the following technical solutions.

The present disclosure provides a display panel comprising:
- a substrate;
- a driving circuit layer disposed on a surface of the substrate;
- a light-emitting layer disposed on a surface of the driving circuit layer away from the substrate and comprising a plurality of light-emitting pixels; and
- a color filter layer disposed on a surface of the light-emitting layer away from the driving circuit layer;
- wherein the display panel further comprises a plurality of light-emitting regions corresponding to the light-emitting pixels and a plurality of non-light-emitting regions corresponding to regions between the light-emitting pixels in the light-emitting layer, the color filter layer comprises a plurality of color resists disposed in the light-emitting regions and corresponding to the light-emitting pixels, and overlapping color resists disposed in the non-light-emitting regions. Each of the overlapping color resists comprises at least two color resist layers that are overlapped.

In some embodiments, the light-emitting pixels comprise a first light-emitting pixel, a second light-emitting pixel, and a third light-emitting pixel. The color resists comprise a first color resist, a second color resist, and a third color resist respectively corresponding to the first light-emitting pixel, the second light-emitting pixel, and the third light-emitting pixel. The overlapping color resists at different positions comprise common color resists. A color of the common color resists is same as a color of one of the first color resist, the second color resist, and the third color resist.

In some embodiments, each of the overlapping color resists comprises the common color resist and a fourth color resist. The color of the common color resist is the same as the color of the first color resist. A color of the fourth color resist is same as the color of the second color resist.

In some embodiments, each of the overlapping color resists comprises the common color resist and a fifth color resist. The color of the common color resist is the same as the color of the first color resist, and a color of the fifth color resist is same as the color of the third color resist.

In some embodiments, each of the overlapping color resists comprises the common color resist and a fifth color resist. The color of the common color resist is the same as the color of the second color resist. A color of the fifth color resist is same as the color of the third color resist.

In some embodiments, the overlapping color resists comprise a first overlapping color resist and a second overlapping color resist. The first overlapping color resist comprises the common color resist and a sixth color resist. The second overlapping color resist comprises the common color resist and a seventh color resist. The color of the common color resist is the same as the color of the first color resist, a color of the sixth color resist is same as the color of the second color resist, and a color of the seventh color resist is same as the color of the third color resist.

In some embodiments, the first color resist is a blue color resist, the second color resist is a green color resist, and the third color resist is a red color resist.

In some embodiments, a part of the second color resist that extends to the non-light-emitting region is the sixth color resist, a part of the third color resist that extends to the non-light-emitting region is the seventh color resist, and each of the common color resists comprises a part of the first color resist that extends to the non-light-emitting region and a part that is not connected to the first color resist.

In some embodiments, the common color resists are respectively disposed on a surface of the sixth color resist away from the light-emitting layer and a surface of the seventh color resist away from the light-emitting layer.

In some embodiments, the display panel further comprises a filling material disposed on a region of the second color resist corresponding to the second light-emitting pixel and a region of the third color resist corresponding to the third light-emitting pixel.

In some embodiments, the first color resist is a green color resist, the second color resist is a blue color resist, and the third color resist is a red color resist.

In some embodiments, the first color resist is a red color resist, the second color resist is a green color resist, and the third color resist is a blue color resist.

In some embodiments, the color filter layer further comprises a plurality of monochromatic color resists disposed between the overlapping color resists in the non-light-emitting regions, and a color of the monochromatic color resists is same as the color of the common color resists of the overlapping color resists.

In some embodiments, a width of the monochromatic color resists is greater than a width of the light-emitting pixels, and a width of the overlapping color resists is less than the width of the light-emitting pixels.

In some embodiments, the overlapping color resists are adjacently disposed in the non-light-emitting regions.

In some embodiments, a shape of the first color resist is same as a shape of the first light-emitting pixel.

In some embodiments, the light-emitting pixels comprise a first light-emitting pixel, a second light-emitting pixel, and a third light-emitting pixel. The color resists comprise a first color resist, a second color resist, and a third color resist respectively corresponding to the first light-emitting pixel, the second light-emitting pixel, and the third light-emitting pixel. The overlapping color resists comprise a first overlapping color resist, a second overlapping color resist, and a third overlapping color resist. The first overlapping color resist comprises two color resist layers whose colors are respectively same as colors of the first color resist and the second color resist. The second overlapping color resist comprises two color resist layers whose colors are respectively same as colors of the first color resist and the third color resist. The third overlapping color resist comprises two color resist layers whose colors are respectively same as the colors of the second color resist and the third color resist.

In some embodiments, each of the overlapping color resists comprises three color resist layers that are overlapped.

In some embodiments, the light-emitting pixels comprise a first light-emitting pixel, a second light-emitting pixel, and a third light-emitting pixel. The color resists comprise a first color resist, a second color resist, and a third color resist respectively corresponding to the first light-emitting pixel, the second light-emitting pixel, and the third light-emitting pixel, and colors of the three overlapped color resist layers of the overlapping color resists are respectively same as colors of the first color resist, the second color resist, and the third color resist.

In some embodiments, the color filter layer has a thickness of 2 μm to 10 μm.

The present disclosure provides a display panel. The display panel comprises a substrate, a driving circuit layer, a light-emitting layer d, and a color filter layer. The driving circuit layer is disposed on a surface of the substrate. The light-emitting layer is disposed on a surface of the driving circuit layer away from the substrate and comprising a plurality of light-emitting pixels. The color filter layer is disposed on a surface of the light-emitting layer away from the driving circuit layer. The display panel further comprises a plurality of light-emitting regions corresponding to the light-emitting pixels and a plurality of non-light-emitting regions corresponding to regions between the light-emitting pixels in the light-emitting layer. The color filter layer comprises a plurality of color resists disposed in the light-emitting regions and corresponding to the light-emitting pixels, and overlapping color resists disposed in the non-light-emitting regions. Each of the overlapping color resists comprises at least two color resist layers that are overlapped. In the present disclosure, the color resists are disposed in the light-emitting regions and correspond to the light-emitting pixels, and the overlapping color resists are disposed in the non-light-emitting regions, so as to replace polarizers. This increases a light transmittance of the display panel, reduces a reflectivity of the display panel, and reduces a thickness of the display panel. Furthermore, because the overlapping color resists are used to replace a black matrix in the non-light-emitting regions, process steps are reduced.

BRIEF DESCRIPTION OF DRAWINGS

Specific implementation of the present disclosure will be described in detail below in conjunction with accompanying drawings to make technical solutions and beneficial effects of the present disclosure obvious.

DETAILED DESCRIPTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure.

Figure 1:
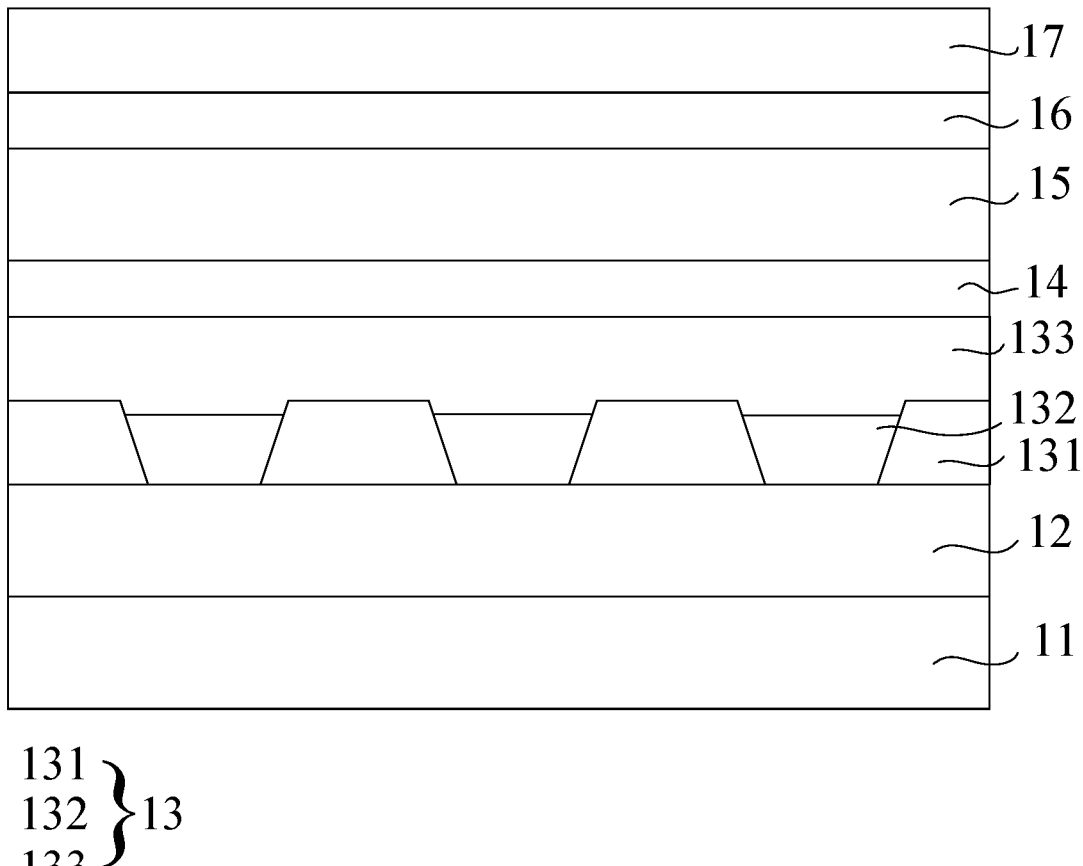
FIG. 1 is a schematic structural diagram of an organic light-emitting diode (OLED) display panel in the prior art.

As shown in FIG. 1, a current organic light-emitting diode (OLED) display panel comprises a substrate 11, a thin film transistor array layer 12, a light-emitting layer 13, a touch layer 14, a polarizer 15, an adhesive layer 16, and a cover plate 17. The light-emitting layer 13 comprises a pixel defining layer 131, a light-emitting material 132, and a cathode layer 133. In the OLED display device, a polarizer 15 is disposed to eliminate reflected light. However, because a thickness of the polarizer 15 is relatively large, generally 104 μm, a thickness of the OLED display panel is relatively large. Furthermore, a light transmittance of the polarizer 15 is relatively low, generally 43.5%, which results in relatively high power consumption and heat generation of the OLED display panel during display. Therefore, current OLED display devices have a technical problem that the OLED display devices have relatively high heat generation and power consumption due to relatively low light transmittances of their polarizers.

In view of the above technical problem, the present disclosure provides a display panel and a method for manufacturing the same, and a display device to solve the above technical problem.

Figure 2:
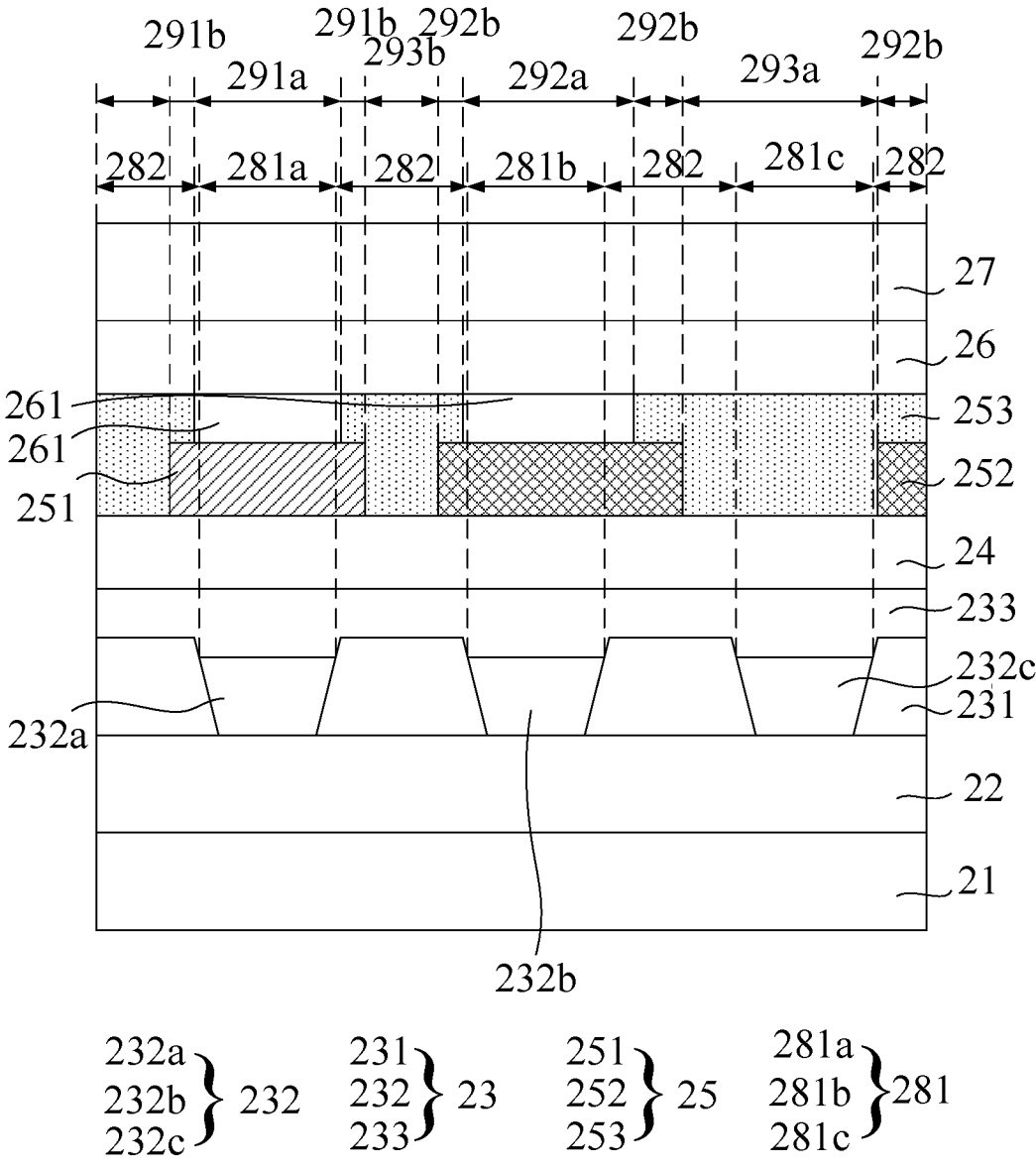
FIG. 2 is a schematic diagram of a display panel according to an embodiment of the present disclosure.

As shown in FIG. 2, the present disclosure provides a display panel comprising:

a substrate 21;

a driving circuit layer 22 disposed on a surface of the substrate 21;

a light-emitting layer 23 disposed on a surface of the driving circuit layer 23 away from the substrate 21 and comprising a plurality of light-emitting pixels 232; and a color filter layer 25 disposed on a surface of the light-emitting layer 23 away from the driving circuit layer 22.

The display panel further comprises a plurality of light-emitting regions 281 corresponding to the light-emitting pixels 232 and a plurality of non-light-emitting regions 282 corresponding to regions between the light-emitting pixels 232 in the light-emitting layer 23.

The color filter layer 25 comprises a plurality of color resists (for example, a part of a first color resist 251 corresponding to a red non-overlapping region 291a) disposed in the light-emitting regions 281 and corresponding to the light-emitting pixels 232, and overlapping color resists disposed in the non-light-emitting regions 282. For example, a part of the first color resist 251 in a red overlapping region 291*b* overlaps with a part of a third color resist 253 in the red overlapping region 291*b* to form an overlapping color resist. Each of the overlapping color resists comprises at least two color resist layers that are overlapped.

The present disclosure provides a display panel. In the display panel, color resists are disposed in light-emitting regions and correspond to light-emitting pixels, and overlapping color resists are disposed in non-light-emitting regions, so as to replace polarizers. This increases a light transmittance of the display panel, reduces a reflectivity of the display panel, and reduces a thickness of the display panel. Furthermore, because the overlapping color resists are used to replace a black matrix in the non-light-emitting regions, process steps are reduced.

In an embodiment, as shown in FIG. 2, the light-emitting pixels 232 comprise a first light-emitting pixel 232*a*, a second light-emitting pixel 232*b*, and a third light-emitting pixel 232*c*. The color resists comprise the first color resist 251, a second color resist 252, and the third color resist 253 respectively corresponding to the first light-emitting pixel 232*a*, the second light-emitting pixel 232*b*, and the third light-emitting pixel 232*c*. The overlapping color resists at different positions comprise common color resists. A color of the common color resists is same as a color of one of the first color resist 251, the second color resist 252, and the third color resist 253. By disposing color resists with corresponding colors in corresponding light-emitting regions, light emitted from the light-emitting regions becomes pure color light after passing through the color resists. By using common color resists, and making a color of the common color resists is same as a color of one of the first color resist, the second color resist, and the third color resist, a common color resist layer can be formed at the same time when the first color resist, the second color resist, or the third color resist is formed, thereby reducing process difficulty.

Specifically, as shown in FIG. 2, the overlapping color resist located in the red overlapping region 291*b* comprises the part of the first color resist 251 and the part of the third color resist 253. The overlapping color resist located in a green overlapping region 292*b* comprises a part of the second color resist 252 and a part of the third color resist 253. The color of the common color resists is the same as the color of the third color resist 253.

Specifically, as shown in FIG. 2, the light-emitting regions 281 comprise a first light-emitting region 281*a* corresponding to the first light-emitting pixel 232*a*, a second light-emitting region 281*b* corresponding to the second light-emitting pixel 232*b*, and a third light-emitting region 281*c* corresponding to the third light-emitting pixel 232*c*. The color resists comprise the first color resist 251 corresponding to the first light-emitting region 281*a*, the second color resist 252 corresponding to the second light-emitting region 281*b*, and the third color resist 253 corresponding to the third light-emitting region 281*c*. In the non-light-emitting regions 282, a part of the first color resist 251 and a part of the third color resist 253 are overlapped to form an overlapping color resist, and a part of the second color resist 252 and a part of the third color resist 253 are overlapped to form another overlapping color resist. If the first color resist 251 is a red color resist, the second color resist 252 is a green color resist, and the third color resist 253 is a blue color resist, the common color resists are blue color resists. This reduces types of overlapping color resists when forming the overlapping color resists, thereby reducing difficulty of forming the overlapping color resists. This replaces a black matrix with the overlapping color resists, thereby reducing process steps.

In an embodiment, each of the overlapping color resists comprises the common color resist and a fourth color resist. The color of the common color resist is the same as the color of the first color resist. A color of the fourth color resist is same as the color of the second color resist. When disposing the overlapping color resists, after forming the color resists corresponding to the light-emitting pixels, the common color resists with the same color as the first color resist and the fourth color resists with the same color as the second color resist may be formed in the non-light-emitting regions. In this way, when forming the overlapping color resists, the first color resist may be formed first. When patterning the first color resist, a part of the first color resist in the non-light-emitting region is remained, and then, when patterning the second color resist, a part of the second color resist in the non-light-emitting region is remained, thereby forming the common color resist and the fourth color resist. This reduces the process difficulty. The overlapping color resists blocks light in non-light-emitting regions to avoid light crosstalk. Furthermore, because the overlapping color resists and the color resists corresponding to the light-emitting pixels are separately disposed, colors of the overlapping color resists may be determined according to requirements, and are not limited by colors of the color resists corresponding to the light-emitting pixels.

In an embodiment, each of the overlapping color resists comprises the common color resist and a fifth color resist. The color of the common color resist is the same as the color of the first color resist, and a color of the fifth color resist is same as the color of the third color resist. When disposing the overlapping color resists, after forming the color resists corresponding to the light-emitting pixels, the common color resists with the same color as the first color resist and the fifth color resists with the same color as the third color resist may be formed in the non-light-emitting regions. In this way, when forming the overlapping color resists, the first color resist may be formed first. When patterning the first color resist, the part of the first color resist in the non-light-emitting region is remained, and then, when patterning the third color resist, a part of the third color resist in the non-light-emitting region is remained, thereby forming the common color resist and the fifth color resist. This reduces the process difficulty. The overlapping color resists blocks light in non-light-emitting regions to avoid light crosstalk. Furthermore, because the overlapping color resists and the color resists corresponding to the light-emitting pixels are separately disposed, colors of the overlapping color resists may be determined according to requirements, and are not limited by colors of the color resists corresponding to the light-emitting pixels.

In an embodiment, each of the overlapping color resists comprises the common color resist and the fifth color resist. The color of the common color resist is the same as the color of the second color resist. The color of the fifth color resist is same as the color of the third color resist. When disposing the overlapping color resists, after forming the color resists corresponding to the light-emitting pixels, the common color resists with the same color as the second color resist and the fifth color resists with the same color as the third color resist may be formed in the non-light-emitting regions. In this way, when forming the overlapping color resists, the second color resist may be formed first. When patterning the second color resist, the part of the second color resist in the non-light-emitting region is remained, and then, when patterning the third color resist, the part of the third color resist in the non-light-emitting region is remained, thereby forming the common color resist and the fifth color resist. This reduces the process difficulty. The overlapping color resists blocks light in non-light-emitting regions to avoid light crosstalk. Furthermore, because the overlapping color resists and the color resists corresponding to the light-emitting pixels are separately disposed, colors of the overlapping color resists may be determined according to requirements, and are not limited by colors of the color resists corresponding to the light-emitting pixels.

In an embodiment, the overlapping color resists comprise a first overlapping color resist and a second overlapping color resist. The first overlapping color resist comprises the common color resist and a sixth color resist. The second overlapping color resist comprises the common color resist and a seventh color resist. The color of the common color resist is the same as the color of the first color resist, a color of the sixth color resist is same as the color of the second color resist, and a color of the seventh color resist is same as the color of the third color resist. When disposing the overlapping color resists, the colors of the sixth color resist and the seventh color resist are the same as the colors of the second color resist and the third color resist, respectively. And, the first overlapping color resist may be disposed in the non-emitting region adjacent to the second color resist, and the second overlapping color resist may be disposed in the non-emitting region adjacent to the third color resist, thereby shielding the non-emitting regions and reducing the process steps.

In an embodiment, the first color resist is a blue color resist, the second color resist is a green color resist, and the third color resist is a red color resist. The blue color resist is the common color resist. A part of the blue color resist and a part of the green color resist are overlapped, and another part of the blue color resist is overlapped with a part of the red color resist, thereby shielding the non-light-emitting regions. This avoids light mixing and poor display effect. Furthermore, there is no need to dispose a black matrix, thereby reducing the process steps.

When the color resists and the overlapping color resists are disposed separately, there will be a technical problem of more process steps and low manufacturing efficiency of the display panel. In an embodiment, a part of the second color resist that extends to the non-light-emitting region is the sixth color resist, a part of the third color resist that extends to the non-light-emitting region is the seventh color resist, and each of the common color resists comprises a part of the first color resist that extends to the non-light-emitting region and a part that is not connected to the first color resist. When forming the first color resist and the second color resist, the first color resist and the second color resist extend to the non-light emitting region, which reduces the formation of the first color resist, the second color resist, the sixth color resist and the seventh color resist Steps to reduce the difficulty of the process. Furthermore, when forming the common color resists and the third color resist, the part corresponding to the light-emitting pixel and the common color resists may be obtained by patterning the first color resist, thereby reducing the process steps and increasing the manufacturing efficiency of the display panel.

In an embodiment, the common color resists are respectively disposed on a surface of the sixth color resist away from the light-emitting layer and a surface of the seventh color resist away from the light-emitting layer. That is, the common color resists are disposed outside, so that when forming the overlapping color resists, an entire color resist layer may be directly formed, and then patterned to form the common color resists, thereby reducing the process steps.

Specifically, when the blue color resist is formed as the common color resists, the red color resist is formed as the sixth color resist, and the green color resist is formed as the seventh color resist, the blue color resist is disposed on a side of the red color resist away from the light-emitting layer. Furthermore, in a region where a part of the green color resist and a part of the blue color resist form the overlapping color resist, the part of the blue color resist is disposed on a side of the part of the green color resist away from the light-emitting layer. When overlapping parts of the color resists in the non-light-emitting regions to form the overlapping color resists, the blue color resist are disposed near a light-incident side. Because a reflectivity of the blue color resist is lower than a reflectivity of the red color resist and a reflectivity of the green color resist, light is absorbed when it irradiates the blue color resist, thereby reducing a reflectivity of the display panel.

When color resists in the non-light-emitting regions are overlapping color resists, a thickness of the non-light-emitting regions will be greater than a thickness of the light-emitting regions. In an embodiment, the display panel further comprises a filling material disposed on a region of the second color resist corresponding to the second light-emitting pixel and a region of the third color resist corresponding to the third light-emitting pixel. The filling material is disposed on the second color resist and the third color resist, so that the filling material can fill up a height difference between the light-emitting regions and the non-light-emitting regions, thereby facilitating arrangement of subsequent layers.

Specifically, as shown in FIG. 2, for example, the first color resist 251 is the red color resist, the second color resist 252 is the green color resist, the third color resist 253 is the blue color resist, and the color of the common color resists is the same as the color of the third color resist. In the first light-emitting region 281*a*, a filling material 261 is disposed on a side of the first color resist 251 away from the light-emitting layer 23. In the second light-emitting region 281*b*, the filling material 261 is disposed on a side of the second color resist 252 away from the light-emitting layer 23. The filling material is disposed on the first light-emitting region and the second light-emitting region, and a thickness of the filling material is consistent with a height difference between the blue color resist and the red color resist, and a height difference between the blue color resist and the green color resist, so that a surface of the color filter layer is flat, thereby facilitating the arrangement of the subsequent layers.

Specifically, the filling material is disposed on a side of a part of the red color resist that does not overlap with the blue color resist, and on a side of a part of the green color resist that does not overlap with the blue color resist. The filling material is disposed on the part of the red color resist that does not overlap with the blue color resist and the part of the green color resist that does not overlap with the blue color resist, so that regions of the color filter layer whose height is lower than a thickness of the blue color resist is filled. This ensures that the color filter layer is flat, so as to facilitate the arrangement of the subsequent layers.

In an embodiment, the display panel further comprises an optical adhesive layer. The optical adhesive layer comprises the filling material. An optical adhesive has a good light transmittance. Therefore, when filling the part of the red color resist that does not overlap with the blue color resist and the part of the green color resist that does not overlap with the blue color resist, the optical adhesive can directly fill the part of the red color resist that does not overlap with the blue color resist and the part of the green color resist that does not overlap with the blue color resist to form the filling material, thereby reducing the process steps. Furthermore, a light transmittance of the optical adhesive is relatively high, which improves a light transmittance of the display panel.

In an embodiment, the first color resist is the green color resist, the second color resist is the blue color resist, and the third color resist is the red color resist. The green color resist is the common color resist. A part of the green color resist and a part of the blue color resist are overlapped, and another part of the green color resist is overlapped with a part of the red color resist, thereby shielding the non-light-emitting regions. This avoids the light mixing and the poor display effect. Furthermore, there is no need to dispose a black matrix, thereby reducing the process steps.

In an embodiment, the first color resist is a red color resist, the second color resist is a green color resist, and the third color resist is a blue color resist.

The red color resist is the common color resist. A part of the red color resist and a part of the green color resist are overlapped, and another part of the red color resist is overlapped with a part of the blue color resist, thereby shielding the non-light-emitting regions. This avoids the light mixing and the poor display effect. Furthermore, there is no need to dispose a black matrix, thereby reducing the process steps.

When the red color resist, the green color resist, and the blue color resist are overlapped, there may be a problem that a thickness of the non-light emitting regions is relatively large, which results in a relatively large thickness of the display panel. In an embodiment, the color filter layer further comprises a plurality of monochromatic color resists disposed between the overlapping color resists in the non-light-emitting regions. A color of the monochromatic color resists is same as the color of the common color resists of the overlapping color resists. The overlapping color resists are disposed separately, the monochromatic color resists are disposed between the overlapping color resists, and the color of the monochromatic color resist is the same as the color of the common color resists, thereby shielding the non-light-emitting regions and reducing the thickness of the display panel.

Specifically, as shown in FIG. 2, for example, the first color resist 251 is a red color resist, the second color resist 252 is a green color resist, the third color resist 253 is a blue color resist, and the color of the common color resists is the same as the color of the third color resist. A part of the first color resist 251 extending to a non-light emitting region and a part of the third color resist 253 form a first overlapping color resist. A part of the second color resist 252 extending to another non-light emitting region and another part of the third color resist 253 form a second overlapping color resist. A monochromatic color resist is disposed between the first overlapping color resist and the second overlapping color resist. A color of the monochromatic color resist is same as the color of the common color resists. The red color resist does not contact the green color resist, the red color resist and the green color resist are disposed on different parts of a same layer, the blue color resist is filled between adjacent overlapping color resists, thereby reducing the thickness of the display panel. Because the blue color resist has a low reflectivity, a light reflectivity of the display panel is further reduced.

Specifically, as shown in FIG. 2, the monochromatic color resists and the common color resists are integrally formed. That is, when forming the monochromatic color resists and the common color resists, the third color resist 253 is directly formed on the first color resist 251 and the second color resist 252, and then, when patterning the third color resist 253, keep the monochromatic color resists and the common color resists. There is no need to form the monochromatic color resists and the common color resists separately, thereby reducing process steps of the display panel.

In the above embodiments, the color of the common color resists is the same as the color of the third color resist as an example to illustrate arrangement of the monochromatic color resists and the overlapping color resists. When the color of the common color resists is the same as the color of the first color resist, or the color of the common color resists is the same as the color of the second color resist, the above arrangement may also be used to reduce the thickness and the light reflectivity of the display panel.

In an embodiment, the overlapping color resists are adjacently disposed in the non-light-emitting regions. That is, when disposing the overlapping color resists, for example, the common color resists of the overlapping color resists is blue color resists, the red color resist may be disposed on a same layer as the blue color resists, the red color resist is in contact with the green color resist, and the blue color resists are formed on the red color resist and the green color resist. Therefore, an overlapping color resist comprising a red color resist and a blue color resist and an overlapping color resist comprising a green color resist and a blue color resist are formed separately. The two overlapping color resists are disposed adjacent to each other to shield the non-light-emitting regions. There is no need to dispose a black matrix, thereby reducing the process steps.

Figure 3:
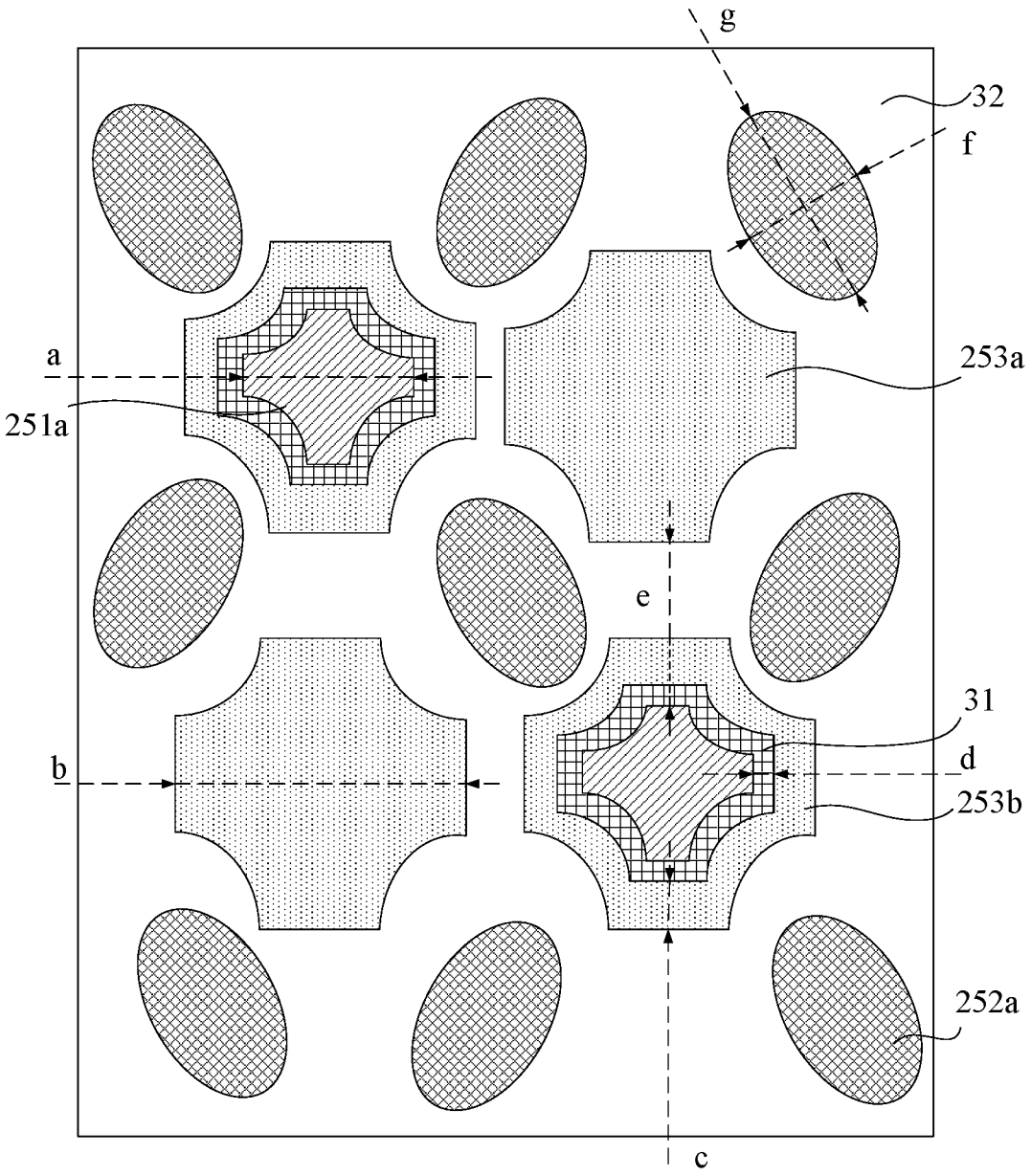
FIG. 3 is a schematic diagram of color resist layers according to an embodiment of the present disclosure.

Because viewing angles of light emitted by the light-emitting pixels in the light-emitting regions are relatively large, only disposing the color resists in the light-emitting regions will cause a problem of partial light loss. As shown in FIG. 2 and FIG. 3, for example, the first color resist 251 is the red color resist, the second color resist 252 is the green color resist, the third color resist 253 is the blue color resist, and the color of the common color resists is the same as the color of the third color resist. The first color resist 251 is disposed in the first light-emitting region 281*a* and extends to the non-light-emitting region 282. The third color resist 253 comprises a blue polarizing part 253*a* corresponding to the third light-emitting pixel 232*c*. The blue polarizing part 253*a* is disposed in the third light-emitting region 281*c* and extends to the non-light-emitting region 282. The second color resist 252 is disposed in a region corresponding to the first color resist 251, a region corresponding to the blue polarizing part 253*a*, and all regions outside the monochromatic color resists. The red color resist extends from the first light-emitting region to the non-light-emitting region. The blue color resist extends from the third light-emitting region to the non-light-emitting region. The green color resist is disposed in a region corresponding to the red color resist, a region corresponding to the blue polarized portion, and all regions outside the monochromatic color resists. Therefore, when lights with various colors are emitted at a large viewing angle, even if the lights are emitted to the non-emitting regions, the lights can still be emitted in pure colors due to the color resists in the non-emitting regions. By disposing the green color resist on an entire surface, the process difficulty is reduced. When forming the overlapping color resists, the green color resist may be directly formed at the same time as the color resists corresponding the light-emitting pixels, thereby reducing the process steps.

Specifically, as shown in FIG. 2, a portion of the part of the first color resist 251 disposed in the non-light-emitting region 282 does not overlap with the third color resist 253, and a portion of the part of the green color resist 252 disposed in the non-light-emitting region 282 does not overlap the blue color resist 253. Parts of the red color resist, the green color resist, and the blue color resist are disposed in the non-display regions. When light with a large viewing angle is emitted through the color resists with the corresponding colors, in order to avoid light mixing, make the red color resist, the green color resist, and the blue color resist have non-overlapping parts in the non-luminous regions. This keeps the light emitted by the light-emitting material in pure colors and improves display effect.

Specifically, as shown in FIG. 2 and FIG. 3, the first color resist 251 comprises a first part 251a disposed in the red non-overlapping region 291a and a second part disposed in the red overlapping region 291b. The third color resist 253 comprises the blue polarizing part 253a disposed in the blue non-overlapping region 293a, a monochromatic color resist 253b disposed in a region 293b corresponding to a gap between the first color resist 251 and the second color resist 252, a first blue overlapping part disposed in the red overlapping area 291b, and a second blue overlapping part disposed in the green overlapping area 292b. The first blue overlapping part and the second blue overlapping part are two common color resists. The second color resist 252 comprises a first part 252a disposed in the green non-overlapping region 292a and a second part disposed in the green overlapping region 292b. In FIG. 3, reference numeral 31 denotes the second part of the first color resist and the first blue overlapping part that are overlapped, and reference numeral 32 denotes the second part of the second color resist and the second blue overlapping part that are overlapped. FIG. 2 and FIG. 3 show that the color resists with various colors all extend beyond the light-emitting regions to the non-light-emitting regions, so that light emitted at a large viewing angle can pass through the color resists of the corresponding colors. Because a distance between the red color resist and the blue color resist is relatively large, disposing the green color resist on an entire surface reduces the process difficulty. Furthermore, by overlapping two color resists in each of the non-light emitting regions, the thickness of the display panel is reduced.

In an embodiment, as shown in FIG. 3, a width a of the first part 251a of the first color resist 251 is 33.70 μm, and a width d of the second part of the first color resist 251 is 3.0 μm. A width c of the monochromatic color resist 253b in the gap is 5.7 μm. A long axis length g of the first part 252a of the second color resist 252 is 35.50 μm, and a short axis length f of the first part 252a of the second color resist 252 is 26.70 μm. A width b of the blue polarizing part 253a of the third color resist 253 is 45.70 μm. A distance e between the first part 251a of the first color resist 251 and the blue polarizing part 253a of the third color resist 253 is 24.7 μm.

In an embodiment, a shape of the first color resist is same as a shape of the first light-emitting pixel, and a projection of the first color resist on the substrate is symmetrically disposed around a projection of the first light-emitting pixel on the substrate. When disposing the red color resist, a shape of the red color resist is same as a shape of the red light-emitting pixel, and a projection of the red color resist on the substrate is symmetrically disposed around a projection of the red light-emitting pixel on the substrate, so that a part of the red color resist in the non-light-emitting region is disposed around the light-emitting region. Therefore, light with a large viewing angle emitted by the red light-emitting pixel can be emitted from the red color resist. Because the projection of the red color resist is symmetrically disposed with respect to the projection of the red light-emitting pixel, the light emitted by the red light-emitting pixel is evenly emitted. This avoids that an intensity of light on one side is greater than intensities of light on other directions, resulting in uneven display.

In an embodiment, a width of the monochromatic color resists is greater than a width of the light-emitting pixels, and a width of the overlapping color resists is less than the width of the light-emitting pixels. By making the width of the monochromatic color resists greater than the width of the light-emitting pixels, and making the width of the overlapping color resists greater than the width of the light-emitting pixels, light mixing in different light-emitting regions can be avoided, and display effect of the display panel can be improved.

In an embodiment, the light-emitting pixels comprise a first light-emitting pixel, a second light-emitting pixel, and a third light-emitting pixel. The color resists comprise a first color resist, a second color resist, and a third color resist respectively corresponding to the first light-emitting pixel, the second light-emitting pixel, and the third light-emitting pixel. The overlapping color resists comprise a first overlapping color resist, a second overlapping color resist, and a third overlapping color resist. The first overlapping color resist comprises two color resist layers whose colors are respectively same as colors of the first color resist and the second color resist. The second overlapping color resist comprises two color resist layers whose colors are respectively same as colors of the first color resist and the third color resist. The third overlapping color resist comprises two color resist layers whose colors are respectively same as the colors of the second color resist and the third color resist.

In an embodiment, each of the overlapping color resists comprises three color resist layers that are overlapped.

In an embodiment, the light-emitting pixels comprise a first light-emitting pixel, a second light-emitting pixel, and a third light-emitting pixel. The color resists comprise a first color resist, a second color resist, and a third color resist respectively corresponding to the first light-emitting pixel, the second light-emitting pixel, and the third light-emitting pixel, and colors of the three overlapped color resist layers of the overlapping color resists are respectively same as colors of the first color resist, the second color resist, and the third color resist.

In an embodiment, the driving circuit layer comprises a buffer layer, an active layer, a gate insulating layer, a gate layer, a source and drain layer, an interlayer insulating layer, and a planarization layer. In the present disclosure, the driving circuit layer may comprise a thin film transistor with a bottom gate structure, or a thin film transistor with a top gate structure.

In an embodiment, as shown in FIG. 2, the light-emitting layer 23 comprises a pixel electrode layer, a pixel defining layer 231, the light-emitting pixels 232, and a common electrode layer 233. The present disclosure takes a top-emitting display panel as an example to illustrate a design of the color filter layer, but the display panel in the present disclosure may also be a bottom-emitting display panel.

In an embodiment, the display panel further comprises an encapsulation layer. The encapsulation layer comprises a first inorganic layer, an organic layer, and a second inorganic layer.

In an embodiment, as shown in FIG. 2, the display panel further comprises a touch layer 24. The present disclosure takes direct on cell touch (DOT, directly fabricating a touch layer on an encapsulation layer) as an example for description, but the touch layer may also be disposed in other ways.

In an embodiment, as shown in FIG. 2, the display panel further comprises an adhesive layer 26. The adhesive layer 26 is made of optically clear adhesive (OCA).

In an embodiment, as shown in FIG. 2, the display panel further comprises a cover plate 27.

In an embodiment, the color filter layer has a thickness of 2 µm to 10 µm. Specifically, the color filter layer has a thickness of 5 µm.

Figure 4:
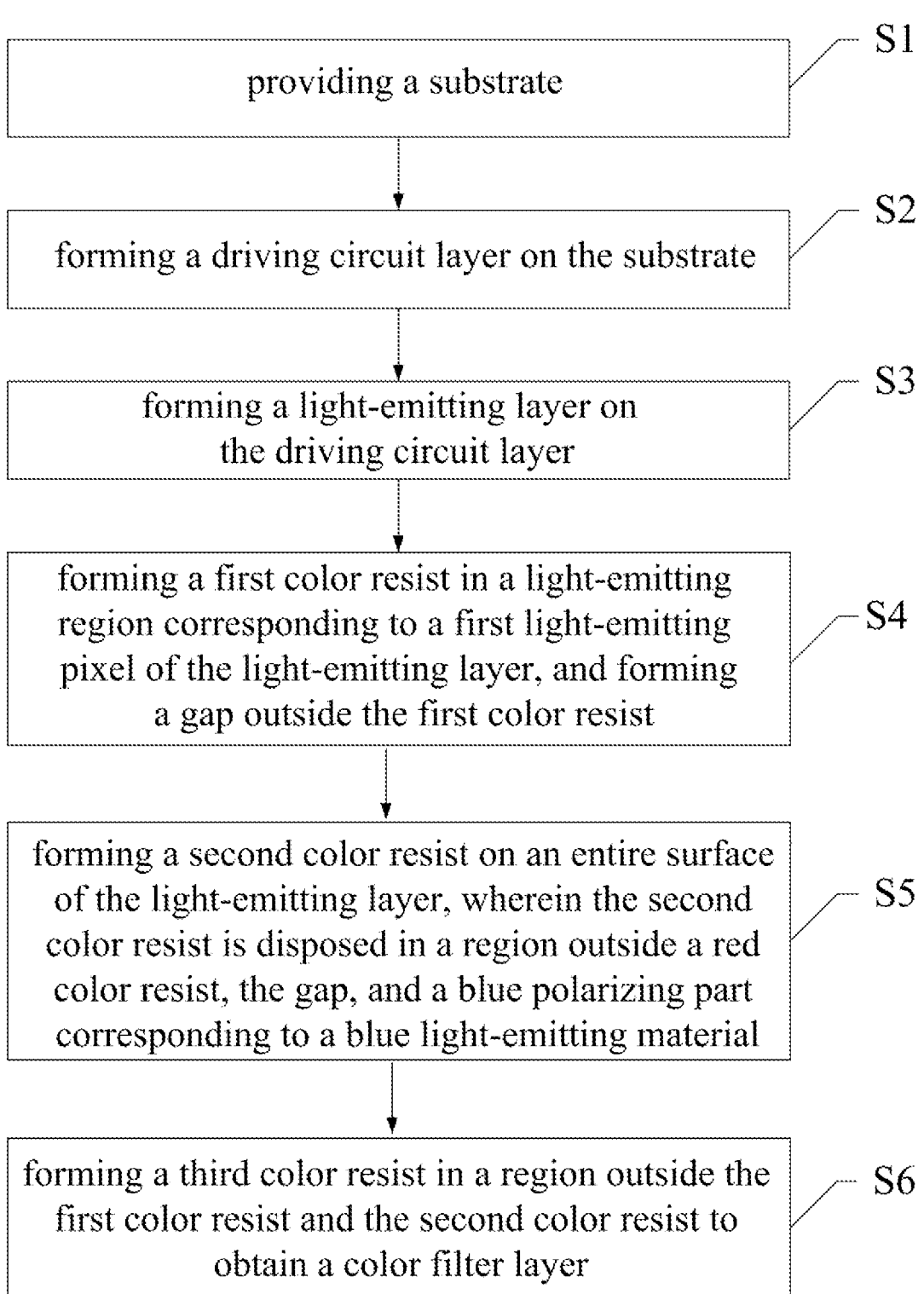
FIG. 4 is a flowchart of a method for manufacturing a display panel according to an embodiment of the present disclosure.

Furthermore, as shown in FIG. 4, the present disclosure further provides a method for manufacturing a display panel, which comprises:

S1: providing a substrate;

S2: forming a driving circuit layer on the substrate;

S3: forming a light-emitting layer on the driving circuit layer;

S4: forming a first color resist in a light-emitting region corresponding to a first light-emitting pixel of the light-emitting layer, and forming a gap outside the first color resist;

S5: forming a second color resist on an entire surface of the light-emitting layer, wherein the second color resist is disposed in a region outside a red color resist, the gap, and a blue polarizing part corresponding to a blue light-emitting material; and S6: forming a third color resist in a region outside the first color resist and the second color resist to obtain a color filter layer.

The present disclosure provides a method for manufacturing a display panel. In the display panel made by the method, color resists are disposed in light-emitting regions, and the color resists are overlapped in non-light-emitting regions, so as to replace polarizers. This increases a light transmittance of the display panel, reduces a reflectivity of the display panel, and reduces a thickness of the display panel. Furthermore, because the overlapping color resists are used to replace a black matrix in the non-light-emitting regions, process steps are reduced.

Figure 5:
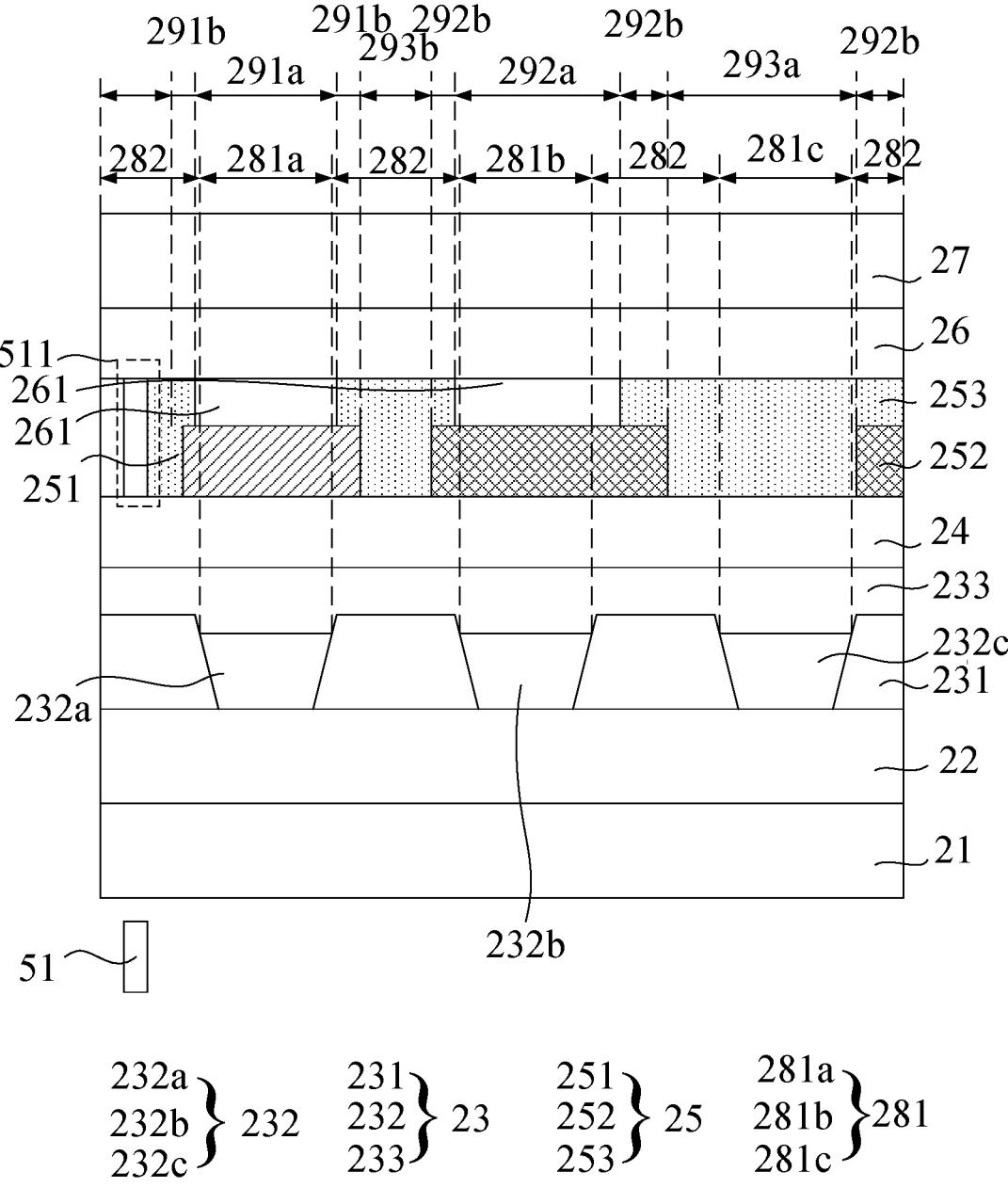
FIG. 5 is a schematic diagram of a display device according to an embodiment of the present disclosure.

Furthermore, as shown in FIG. 5, the present disclosure further provides a display device comprising a display panel and an electronic component 51. The display panel comprises:

a substrate 21;

a driving circuit layer 22 disposed on a surface of the substrate 21;

a light-emitting layer 23 disposed on a surface of the driving circuit layer 23 away from the substrate 21 and comprising a plurality of light-emitting pixels 232; and a color filter layer 25 disposed on a surface of the light-emitting layer 23 away from the driving circuit layer 22.

The display panel further comprises a plurality of light-emitting regions 281 corresponding to the light-emitting pixels 232 and a plurality of non-light-emitting regions 282 corresponding to regions between the light-emitting pixels 232 in the light-emitting layer 23.

The color filter layer 25 comprises a plurality of color resists (for example, a part of a first color resist 251 corresponding to a red non-overlapping region 291a) disposed in the light-emitting regions 281 and corresponding to the light-emitting pixels 232, and overlapping color resists disposed in the non-light-emitting regions 282. For example, a part of the first color resist 251 in a red overlapping region 291b overlaps with a part of a third color resist 253 in the red overlapping region 291b to form an overlapping color resist. Each of the overlapping color resists comprises at least two color resist layers that are overlapped.

The present disclosure provides a display device comprising a display panel and an electronic component. In the display panel, color resists are disposed in light-emitting regions and correspond to light-emitting pixels, and overlapping color resists are disposed in non-light-emitting regions, so as to replace polarizers. This increases a light transmittance of the display panel, reduces a reflectivity of the display panel, and reduces a thickness of the display panel. Furthermore, because the overlapping color resists are used to replace a black matrix in the non-light-emitting regions, process steps are reduced.

In an embodiment, as shown in FIG. 5, the color filter layer is provided with a via hole 511. When an electronic component is disposed under the display device, a via hole may be formed in the color filter layer to improve lighting effect of the electronic component.

In an embodiment, the electronic component comprises an under-screen camera.

According to the above embodiment, the following can be understood.

The present disclosure provides a display panel and a method for manufacturing the same, and a display device. The display panel comprises a substrate, a driving circuit layer, a light-emitting layer d, and a color filter layer. The driving circuit layer is disposed on a surface of the substrate. The light-emitting layer is disposed on a surface of the driving circuit layer away from the substrate and comprising a plurality of light-emitting pixels. The color filter layer is disposed on a surface of the light-emitting layer away from the driving circuit layer. The display panel further comprises a plurality of light-emitting regions corresponding to the light-emitting pixels and a plurality of non-light-emitting regions corresponding to regions between the light-emitting pixels in the light-emitting layer. The color filter layer comprises a plurality of color resists disposed in the light-emitting regions and corresponding to the light-emitting pixels, and overlapping color resists disposed in the non-light-emitting regions. Each of the overlapping color resists comprises at least two color resist layers that are overlapped. In the present disclosure, the color resists are disposed in the light-emitting regions and correspond to the light-emitting pixels, and the overlapping color resists are disposed in the non-light-emitting regions, so as to replace polarizers. This increases a light transmittance of the display panel, reduces a reflectivity of the display panel, and reduces a thickness of the display panel. Furthermore, because the overlapping color resists are used to replace a black matrix in the non-light-emitting regions, process steps are reduced.

In the above embodiments, the description of each embodiment has its own emphasis. For parts not detailed in one embodiment, reference may be made to the related descriptions in other embodiments.

The display panel and the method for manufacturing the same, and the display device provided by the embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents.

These modifications or replacements do not cause essence of corresponding technical solutions to depart from the scope of the technical solutions of the embodiments of the present disclosure.

What is claimed is:

1. A display panel, comprising:

a substrate;

a driving circuit layer disposed on a side of the substrate;

a light-emitting layer disposed on a side of the driving circuit layer away from the substrate and comprising a plurality of light-emitting pixels; and a color filter layer disposed on a side of the light-emitting layer away from the driving circuit layer;

wherein the display panel has a plurality of light-emitting regions each corresponding to one of the light-emitting pixels and a plurality of non-light-emitting regions each corresponding to a region between two adjacent ones of the light-emitting regions;

the color filter layer comprises a plurality of color resists each disposed in one of the light-emitting regions and corresponding to one of the light-emitting pixels, and a plurality of color resist stacks each disposed in one of the non-light-emitting regions; and each of the color resist stacks comprises a lower color resist and an upper color resist disposed on a side of the lower color resist away from the driving circuit layer, and at least one of the color resist stacks protrudes toward a side of the color filter layer away from the substrate relative to one of the color resists disposed in one of the light-emitting regions adjacent to the at least one of the color resist stacks.

2. The display panel according to claim 1, wherein the light-emitting pixels comprise a first light-emitting pixel, a second light-emitting pixel and a third light-emitting pixel, the color resists comprise a first color resist, a second color resist and a third color resist respectively corresponding to the first light-emitting pixel, the second light-emitting pixel and the third light-emitting pixel, the upper color resist comprises a common color resist, and a color of the common color resist is same as a color of one of the first color resist, the second color resist and the third color resist.

3. The display panel according to claim 2, wherein the lower color resist comprises a fourth color resist, the color of the common color resist is same as a color of the first color resist, and a color of the fourth color resist is same as a color of the second color resist.

4. The display panel according to claim 2, wherein the lower color resist comprises a fifth color resist, the color of the common color resist is same as a color of the first color resist, and a color of the fifth color resist is same as a color of the third color resist.

5. The display panel according to claim 2, wherein the lower color resist comprises a fifth color resist, the color of the common color resist is same as a color of the second color resist, and a color of the fifth color resist is same as a color of the third color resist.

6. The display panel according to claim 2, wherein a first color resist stack and a second color resist stack of the color resist stacks are disposed in one of the non-light-emitting regions, the lower color resist of the first color resist stack comprises a sixth color resist, the lower color resist of the second color resist stack comprises a seventh color resist, the color of the common color resist of each of the first color resist stack and the second color resist stack is same as a color of the first color resist, a color of the sixth color resist is same as a color of the second color resist, and a color of the seventh color resist is same as a color of the third color resist.

7. The display panel according to claim 6, wherein the first color resist is a blue color resist, the second color resist is a green color resist, and the third color resist is a red color resist.

8. The display panel according to claim 7, wherein a part of the second color resist that extends to one of the non-light-emitting regions forms the sixth color resist, a part of the third color resist that extends to one of the non-light-emitting regions forms the seventh color resist, one of the common color resist of the first color resist stack and the common color resist of the second color resist stack comprises a part of the first color resist that extends to one of the non-light-emitting regions, and another one of the common color resist of the first color resist stack and the common color resist of the second color resist stack comprises a color resist portion that is not connected to the first color resist.

9. The display panel according to claim 6, wherein the common color resist of the first color resist stack is disposed on a side of the sixth color resist away from the light-emitting layer and the common color resist of the second color resist stack is disposed on a side of the seventh color resist away from the light-emitting layer.

10. The display panel according to claim 9, further comprising:

a filling material disposed on a side of the second color resist away from the driving circuit layer and a side of the third color resist away from the driving circuit layer.

11. The display panel according to claim 6, wherein the first color resist is a green color resist, the second color resist is a blue color resist, and the third color resist is a red color resist.

12. The display panel according to claim 6, wherein the first color resist is a red color resist, the second color resist is a green color resist, and the third color resist is a blue color resist.

13. The display panel according to claim 2, wherein the color filter layer further comprises a plurality of monochromatic color resists each disposed between two ones of the color resist stacks in one of the non-light-emitting regions, a color of the each of the monochromatic color resists is same as a color of the common color resist of each of the two ones of the color resist stacks, and a thickness of the each of the monochromatic color resists is uniform and consistent with a thickness of the each of the two ones of the color resist stacks.

14. The display panel according to claim 13, wherein a width of the each of the monochromatic color resists is greater than a width of each of the light-emitting pixels, and a width of the each of the two ones of the color resist stacks is less than the width of the each of the light-emitting pixels.

15. The display panel according to claim 2, wherein two ones of the color resist stacks are disposed adjacent to each other in one of the non-light-emitting regions.

16. The display panel according to claim 2, wherein a shape of the first color resist is same as a shape of the first light-emitting pixel.

17. The display panel according to claim 1, wherein the light-emitting pixels comprise a first light-emitting pixel, a second light-emitting pixel and a third light-emitting pixel, the color resists comprise a first color resist, a second color resist and a third color resist respectively corresponding to the first light-emitting pixel, the second light-emitting pixel and the third light-emitting pixel, the color resist stacks comprise a first color resist stack, a second color resist stack and a third color resist stack, colors of the lower color resist and the upper color resist of the first color resist stack are respectively same as a color of the first color resist and a color of the second color resist, colors of the lower color resist and the upper color resist of the second color resist stack are respectively same as the color of the first color resist and a color of the third color resist, and colors of the lower color resist and the upper color resist of the third color resist stack are respectively same as the color of the second color resist and the color of the third color resist.

18. The display panel according to claim 1, wherein the each of the color resist stacks further comprises an additional color resist disposed on a side of the upper color resist.

19. The display panel according to claim 18, wherein the light-emitting pixels comprise a first light-emitting pixel, a second light-emitting pixel and a third light-emitting pixel, the color resists comprise a first color resist, a second color resist and a third color resist respectively corresponding to the first light-emitting pixel, the second light-emitting pixel and the third light-emitting pixel, and colors of the lower color resist, the upper color resist and the additional color resist are respectively same as colors of the first color resist, the second color resist and the third color resist.

20. The display panel according to claim 1, wherein the color filter layer has a thickness of 2 μm to 10 μm.

\* \* \* \* \*